March 12, 1957 G. H. MENHENNETT 2,785,298
SQUELCH CIRCUIT
Filed March 10, 1954
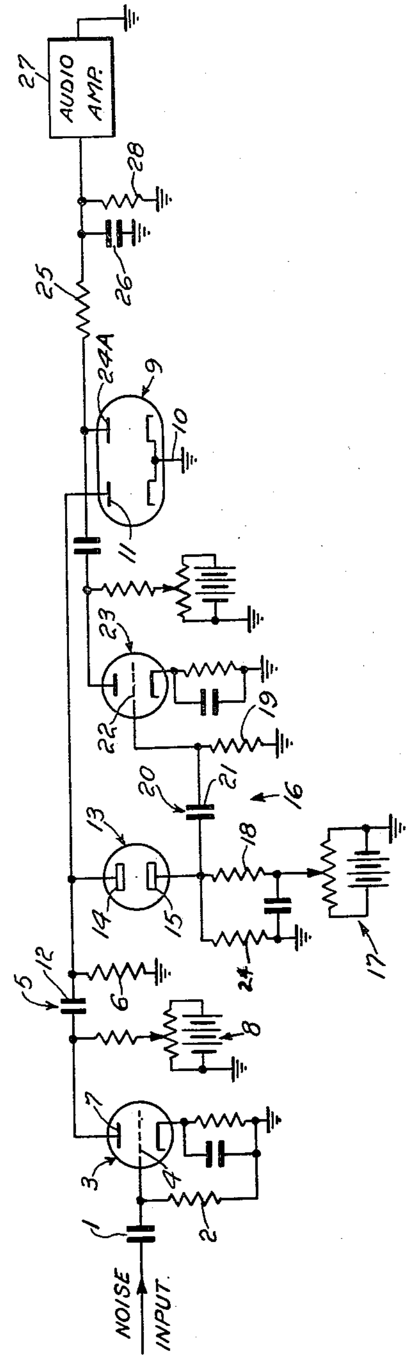
INVENTOR
GERALD H. MENHENNETT
BY R P Morris
ATTORNEY

United States Patent Office 2,785,298

Patented Mar. 12, 1957

2,785,298

SQUELCH CIRCUIT

Gerald H. Menhennett, Middletown Township, Monmouth County, N. J., assignor to International Telephone and Telegraph Corporation, New York, N. Y., a corporation of Maryland Application March 10, 1954, Serial No. 415,224

11 Claims. (Cl. 250—20)

This invention relates to a squelch circuit and particularly to a squelch circuit which operates to mute a receiver in response to a predetermined value of integrated noise energies.

Squelch circuits are generally employed in receivers to eliminate noise energies by blocking the audio stages of the receiver. Squelching systems are employed, particularly, in receivers which have considerable sensitivity so that a disagreeable amount of noise will not be heard in the receiver output when no carrier is present. One well known arrangement makes use of an auxiliary tube arranged to bias the grid of the first audio tube beyond cut-off, unless the grid bias of the auxiliary tube approaches or exceeds cut-off. It is also known to use the automatic volume control system to bias the auxiliary tube; in this type of system, it is possible to make the receiver inoperative until a signal of predetermined amplitude is present.

In known squelching systems however, there exist several significant undesirable features. For example, in receivers, particularly frequency-modulation receivers, which operate in fringe areas, there is a tendency for squelch circuits to operate on momentary decreases in the signal-to-noise ratio. This effect is commonly known as "chopping." This problem arises when the squelch setting is satisfactory for a given signal-to-noise ratio in a given area of reception, and when the conditions of reception are changed, the signal-to-noise ratio is correspondingly changed and causes unwanted sporadic operation of the squelch circuit. The result of this type of unwanted squelch operation is the loss of syllables during communication. To obviate this condition, the conventional circuits have tended to increase the squelch differential required to operate the squelch circuit. The squelch differential is the change in noise voltage level required to operate the squelch circuit. For example, a one decibel (db) squelch differential is construed to mean that a 1 db change in noise voltage reduction changes the receiver from a squelched to an unsquelched condition. Thus, by increasing the squelch differential, the conventional circuits have reduced the sensitivity of the squelching circuit, requiring much greater change in noise voltage before the operation thereof.

Accordingly, it is a first object of this invention to provide a squelch circuit which eliminates the effect known as "chopping," by operating in response to a given value of integrated noise energy, rather than instantaneously as described above.

It is a further object of this invention to provide a squelch circuit of high sensitivity having a minimum squelch differential, in the order of 1 db.

It is a feature of this invention to provide a novel squelch circuit performing the objects mentioned above by employing fewer components than similar circuits heretofore known.

It is a further feature of this invention to provide a squelch circuit which is principally dependent on the frequency of the noise energy and substantially independent of the amplitude of the noise energy above a given value.

In accordance with an aspect of the invention, there is provided a circuit responsive to noise energy for producing a squelch biasing voltage independent of the amplitude of the noise energy, but dependent on the frequency thereof. The invention is characterized by keying a driven relaxation-type oscillator in response to a given level of noise energy, for generating a predeterimned voltage waveform; the waveform being independent of the amplitude of the noise energy. The generated voltage, representative of the noise energy, is integrated in a storage circuit and upon attaining a predetermined value operates as a squelching biasing potential, which is then applied to the appropriate stages.

The above-mentioned and other features and objects of this invention and the manner of attaining them will become more apparent and the invention itself will be best understood, by reference to the following description of an embodiment of the invention taken in conjuction with the accompanying drawing, wherein the figure is a schematic diagram of the squelch circuit.

Referring to the figure, there is shown a squelch circuit comprising a high-pass filter network comprising a capacitor 1 and a resistor 2 coupled in the grid-cathode circuit of a noise amplifier 3. When the carrier signal is removed from the input of a highly sensitive receiver, the resultant noises are predominantly thermal noises developed in the electron tubes; this thermal noise consists of high-frequency oscillations with respect to audio frequencies. If the receiver operates on amplitude modulation, the noise is applied to the grid 4 of amplier 3 from a detector (not shown); if the receiver operates on frequency modulation, the noise is applied from a discriminator to the amplier 3. The high-pass filter discriminates between the audio signals and the noise energy, and applies only the noise energy which is outside the signal band of the receiver, to the amplifier 3.

A coupling circuit, comprising a capacitor 5 and a resistor 6 is coupled in the anode circuit 7 of the amplifier 3. A direct-current source of positive potential 8 is coupled to the anode 7 of the amplifier 3.

A diode 9, comprising a cathode 10 coupled to ground, and an anode 11 coupled to the capacitor 5, is utilized as a noise rectifier, and operates to produce a peak doubling effect across the capacitor 5. The amplifier 3 is biased to a conducting condition by the voltage supply 8 coupled in the anode circuit thereof; consequently, there is a direct-current negative voltage of a magnitude dependent upon the voltage drop across amplifier 3 imposed on the electrode 12 of capacitor 5. This negative potential normally prevents the rectifier 9 from conducting.

Upon receiving noise energy, the amplifier 3, which is preferably a non-linear amplifier, conducts more or less depending on the amplitude variation of the noise energy. However, when the electrode 12 of capacitor 5 goes positive with respect to ground, diode 9 is rendered conducting, thereby limiting the positive excursion of the alternating output from amplifier 3. Thus, upon electrode 12 becoming negative with respect to ground, a negative voltage is stored in the condenser 5, which is equivalent to the direct current supply voltage plus the negative peak of the noise voltage; this is substantially twice the peak noise voltage. Resistor 6 is chosen sufficiently large to prevent capacitor 6 from discharging rapidly therethrough.

A driven relaxation-type oscillator, comprising preferably a gas-discharge tube 13 has one electrode 14 coupled to the negative electrode 12 of the capacitor 5. The other electrode 15 of the gas-discharge tube 13 is coupled over a capacitance-resistance circuit generally indicated at 16, to a direct-current source of positive potential 17 (squelch control potential). The gas-discharge tube 13 is adapted to ignite only when the negative voltage on electrode 12 attains approximately twice the peak noise voltage, which, by way of example, is a desired preselected value. Thus, the frequency of the driven relaxation-oscillator is controlled by the noise peaks, which key it at the beginning of each cycle.

Coupled to the electrode 15 of the gas-discharge tube 13 is the capacitance-resistance circuit 16, comprising resistors 18, 19 and capacitor 20. The capacitor 20 is charged by the source of potential 17 at a rate determined by the time-constant of the capacitance-resistance circuit 16. It is observed that a negative potential is developed on the electrode 21 of the capacitor 20 during the charging thereof. The voltage developed across capacitor 20 is imposed on the grid 22 of an amplifier 23. By way of example, the amplifier 23 may be adjusted to cut off at approximately half the total voltage developed across capacitor 20. Since the capacitor 20 is normally fully charged during the presence of the carrier in the receiver, amplifier 23 is normally cut-off. When the gas-discharge tube 13 is ignited, capacitor 20 is discharged therethrough over resistor 6 to ground, and also over resistor 24 to ground; the resistors 6 and 24 being approximately the same value. Upon the discharge of the capacitor 20, the amplifier 23 is rendered conducting and amplifies the voltage developed across the capacitor 20 which is approximately saw-tooth in waveform. The output from the amplifier 23 is rectified by a diode 24A and the output thereof is stored in an integrating circuit comprising resistor 25 and capacitor 26. Squelching is obtained when the capacitor 26 is charged to a sufficient value to cut-off, for example, the amplifier in the first audio stage 27. A discharge resistor 28 for the integrating circuit may be the grid leak resistor for the audio amplifier to which the integrated voltage is applied.

Since the output from amplifier 23 is dependent only upon the uniform saw-tooth input voltage developed by the oscillator, and is independent of the noise energy amplitude, the gain thereof is uniformly constant over the range of receiver operation for any given setting of the squelch control voltage 17. It is seen that the squelch differential may be set at a minimum, and yet "chopping" is avoided by requiring a predetermined value of integrated noise voltages, before operating the squelch circuit. Accordingly, it is possible to use the amplifier at maximum power gain which results in the minimum squelch differential over the full range of squelch adjustment.

It is observed that the average power output of the amplifier 23 is dependent only upon the frequency of the saw-tooth voltage from the driven relaxation oscillator, and the frequency of the saw-tooth voltage is determined by the frequency of the noise energy.

The adjustment of the squelch control voltage 17 determines the positive potential applied to the electrode 15 of the gas-discharge tube 13 and thus controls the amplitude of the saw-tooth waveform. The noise peaks are restricted in frequency by the intermediate frequency bandwidth of the receiver.

While I have described above the principles of my invention in connection with specific apparatus, it is to be clearly understood that this description is made only by way of example and not as a limitation of the scope of my invention as set forth in the objects thereof and in the accompanying claims.

What is claimed is:

1. A circuit for producing a squelch biasing voltage, comprising an input circuit responsive to noise energy, and means coupled to said input circuit for producing a frequency dependent squelch biasing voltage, independent of the amplitude of said noise energy, said means characterized by generator means responsive to noise voltage above a given level for generating a predetermined voltage waveform, said waveform being substantially independent of the amplitude of said noise energy, and means coupled to the output of said generating means for cumulatively storing given portions of said generated wave to produce said squelch biasing voltage.

2. The circuit according to claim 1, wherein said generating means comprises a driven relaxation-type oscillator, keyed by said given level of noise voltage.

3. The circuit according to claim 2, wherein said relaxation-type oscillator, comprises a gas-discharge device.

4. The circuit according to claim 2, wherein said storing means comprises a capacitance-resistance integrating circuit.

5. The circuit according to claim 3, wherein said input circuit comprises a capacitor-resistor arrangement, means coupled as a positive limiter, to said capacitor, for storing the negative peaks of said noise voltages, and a source of direct current potential coupled to said capacitor-resistor arrangement so as to increase the negative voltage stored in said capacitor, whereby the stored voltage is approximately twice the negative peak value of the noise voltage.

6. The circuit according to claim 5, wherein said gas-discharge device has one electrode coupled to said input circuit, so as to apply said negative potential thereto, and a second electrode coupled to a second capacitor-resistor circuit, means applying a positive potential to said second electrode by positively charging said second capacitor, the rate of charging being determined by the time-constant of said second capacitor-resistor circuit, means including said positive potential and said stored negative noise voltage for keying on said gas-discharge device, whereupon said second capacitor discharges through said gas-discharge device, the voltage waveform across said second capacitor being approximately saw-tooth, and independent of the value of stored noise voltage.

7. The circuit according to claim 6, and further comprising means coupled to one electrode of said second capacitor for amplifying said voltage of saw-tooth waveform, means coupled to the output of said amplifying means for positively limiting the output therefrom, and integrating means coupled to said rectifier for storing the output thereof, whereby the stored voltage constitutes said squelch biasing potential.

8. A circuit for producing a squelch biasing voltage, comprising an amplifier responsive to noise energy, a capacitor-resistor arrangement coupled to the output of said amplifier, a diode rectifier coupled as a positive limiter to said capacitor, a direct-current source of potential coupled to said capacitor so as to increase the negative voltage stored therein, whereby the stored voltage in said capacitor is approximately twice the negative peak value of the noise voltage, a driven relaxation-type oscillator coupled between the negative electrode of said capacitor and a source of direct-current positive potential, said oscillator being keyed in response to a given level of stored negative voltage in said capacitor, means responsive to the operation of said oscillator for producing a voltage of approximately saw-tooth waveform, the waveform being independent of the noise voltage amplitude, and an output circuit coupled to said oscillator for cumulatively storing a given portion of the output thereof to produce said squelch biasing voltage.

9. The circuit according to claim 8, wherein said driven relaxation-type oscillator comprises a gas-discharge-diode having one electrode coupled to the negative electrode of said capacitor, and the other electrode of said gas-discharge-diode being coupled to said source of direct-current positive potential said gas-discharge-diode being ignited in response to noise voltage stored in said capacitor, a second capacitor-resistor circuit coupled to the other electrode of the gas-discharge-diode, the second capacitor being charged by said source of positive potential at a rate determined by the time-constant of the circuit, and discharges through said gas-discharge-diode during conduction thereof, whereby a voltage of approximately saw-tooth waveform is developed across said second capacitor, the saw-tooth voltage being independent of the noise voltage amplitude.

10. A circuit for producing a squelch voltage for a frequency-modulation receiver, comprising a filtering circuit for passing noise energy outside the signal band of said receiver, an amplifier coupled to the output of said filtering circuit and responsive to said noise energy, a capacitor-resistor arrangement coupled to the output of said amplifier, a diode rectifier coupled as a positive limiter to said capacitor, a direct-current source of potential coupled to said capacitor so as to increase the negative voltage stored therein, whereby the stored voltage in said capacitor is approximately twice the negative peak value of the noise voltage, a driven relaxation-type oscillator comprising a gas-discharge-diode having one electrode coupled to the negative electrode of said capacitor, and the other electrode of said gas-discharge-diode being coupled to a source of direct-current positive potential, said gas-discharge-diode being ignited in response to a given level of stored negative voltage in said capacitor, a second amplifier, a second capacitor-resistor circuit coupled between the input of said second amplifier and said other electrode of the gas-discharge-diode, the second capacitor being charged by said source of positive potential at a rate determined by the time-constant of the circuit, and discharges through said gas-discharge-diode during conduction thereof, whereby a voltage of approximately saw-tooth waveform is developed across said second capacitor, the saw-tooth voltage being independent of the noise energy amplitude, and dependent upon the frequency of the noise voltage, means amplifying and positively limiting said voltage waveform successively, and an integrating circuit coupled to said rectifier for cumulatively storing the output thereof, to produce said squelch biasing voltage.

11. The circuit according to claim 10 and further comprising a normally operative audio amplifier, and means applying said squelch biasing voltage to said audio amplifier, thereby blocking it.

References Cited in the file of this patent

UNITED STATES PATENTS 2,060,969 Beers ---------------- Nov. 17, 1936

FOREIGN PATENTS 499,774 Great Britain ---------- Jan. 30, 1939